(12) United States Patent
Huang

(10) Patent No.: US 7,569,909 B2
(45) Date of Patent: Aug. 4, 2009

(54) PHASE CHANGE MEMORY DEVICES AND METHODS FOR MANUFACTURING THE SAME

(75) Inventor: Chen-Ming Huang, Hsinchu County (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 140 days.

(21) Appl. No.: 11/745,980

(22) Filed: May 8, 2007

(65) Prior Publication Data

US 2008/0241741 A1 Oct. 2, 2008

(30) Foreign Application Priority Data

Mar. 27, 2007 (TW) .............................. 96110500 A

(51) Int. Cl.
*H01L 29/00* (2006.01)

(52) U.S. Cl. ............... 257/537; 257/536; 257/E21.495; 365/46; 365/100

(58) Field of Classification Search ................. 257/536, 257/537, E21.495; 365/46, 100
See application file for complete search history.

(56) References Cited

U.S. PATENT DOCUMENTS

| 2006/0003470 | A1 | 1/2006 | Chang | |
|---|---|---|---|---|
| 2008/0011999 | A1* | 1/2008 | Choi et al. | 257/4 |
| 2008/0067486 | A1* | 3/2008 | Karpov et al. | 257/3 |
| 2008/0067491 | A1* | 3/2008 | Lowrey | 257/4 |
| 2008/0138929 | A1* | 6/2008 | Lung | 438/102 |
| 2008/0206921 | A1* | 8/2008 | Lee | 438/102 |
| 2008/0206922 | A1* | 8/2008 | Oliva et al. | 438/102 |
| 2008/0251778 | A1* | 10/2008 | Chen et al. | 257/4 |
| 2008/0268565 | A1* | 10/2008 | Lung | 438/96 |
| 2009/0026439 | A1* | 1/2009 | Park et al. | 257/4 |

* cited by examiner

*Primary Examiner*—Ngan Ngo
(74) *Attorney, Agent, or Firm*—Quintero Law Office

(57) ABSTRACT

Phase change memory devices and methods for manufacturing the same are provided. An exemplary embodiment of a phase change memory device comprises a substrate. A dielectric layer is formed over the substrate and a phase change material layer is embedded in the dielectric layer. A first conductive electrode is also embedded in the dielectric layer to penetrate the phase change material layer and extends perpendicular to a top surface of the dielectric layer.

12 Claims, 14 Drawing Sheets

PHASE CHANGE MEMORY DEVICES AND METHODS FOR MANUFACTURING THE SAME

BACKGROUND

The invention relates to memory devices and more particularly to phase change memory devices and a method for fabricating the same.

Phase change memory devices are non-volatile, highly readable, highly programmable, and require a lower driving voltage/current. Current trends in phase change memory development are to increase cell density and reduce current density thereof.

Phase change material in a phase change memory device has at least two solid phases, a crystalline state and an amorphous state. Transformation between these two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivity on a nanosecond time scale with the input of pico joules of energy. Chalcogenide material is a popular and widely used phase change material in modern phase change memory technology.

Since phase change material allows a reversible phase transformation, memory bit status can be distinguished by determining the phase of phase change material in the memory bit.

FIG. 1 is a schematic diagram of a cross section of a conventional phase change memory cell, in which the phase change memory cell includes a bottom electrode 12 formed over a substrate 10. The bottom electrode 12 is disposed over an insulating layer (not shown) formed over the substrate 10. An insulating layer 14 is formed over the substrate 10, having a heating electrode 16 formed in a part therein. Another insulating layer 18 is formed over the insulating layer 14, having a phase change material layer 20 formed in a part therein. The phase change material layer 20 penetrates the insulating layer 18 and partially contacts the heating electrode 16 thereunder. A top electrode 22 is formed over the insulating layer 18 and contacts a top surface of the phase change material layer 20. In FIG. 1, the heating electrode 16 is formed as an electrode of a plug configuration, having a diameter $D_1$. Thus, the heating electrode 16 and the phase change material layer 20 formed thereover have a contact surface of about $\pi D_1^2/4$ therebetween. FIG. 2 is a schematic diagram showing a top view of the phase change memory cell illustrated in FIG. 1 but without the top electrode 22. FIG. 1 is a cross section taken along line 1-1 in FIG. 2.

During writing mode, currents are generated by the heating electrode 16 to heat an interface between the phase change material layer 20 and the heating electrode 16, thereby transforming a portion (not shown) of the phase change material layer 20 into amorphous phase or crystalline phase depending on currents through the heating electrode 16 and times for heating the phase change material layer 20.

The phase change memory cell illustrated in FIG. 1 has disadvantages such as strong current needed to successfully transform the phase of the phase change materials during writing mode, such that current density applied to the phase change material layer 20 must be increased. One way to increase the current density is to lower the contact surface between the heating electrode 16 and the phase material layer 20 and this is usually achieved by lowering a lateral dimension of the heating electrode 16, such as by lowering the diameter $D_1$ of the heating electrode 16 in FIG. 1.

Nevertheless, reduction of the dimension of the heating electrode 16 is limited by current photolithography ability, limiting size reduction of the heating electrode 16 and increase in current density applied thereto.

SUMMARY

Phase change memory devices and methods for manufacturing the same are provided to thereby solve those issues of the conventional phase change memory devices.

An exemplary embodiment of a phase change memory device comprises a substrate. A dielectric layer is formed over the substrate and a phase change material layer is embedded in the dielectric layer. A first conductive electrode is also embedded in the dielectric layer to penetrate the phase change material layer and extends perpendicular to a top surface of the dielectric layer.

An exemplary embodiment of a method for manufacturing a phase change memory device comprises providing a substrate. A first dielectric layer is formed over the substrate. A phase change material layer is formed over a part of the first dielectric layer. A second dielectric layer is formed over the first dielectric layer and covering the phase change material layer. A first opening is formed to penetrate the second dielectric layer, the phase change material layer, and the first dielectric layer perpendicular to a top surface of the substrate. A first conductive electrode is formed in the first opening. A third dielectric layer is formed over the second dielectric layer and the first conductive electrode. A second opening is formed to penetrate the third dielectric layer and the second dielectric layer perpendicular to a top surface of the substrate and exposing a part of the phase change material layer. A second conductive electrode is formed in the second opening.

Another exemplary embodiment of a method for manufacturing a phase change memory device comprises providing a substrate. A first dielectric layer is formed over the substrate. A first opening is formed to penetrate the first dielectric layer perpendicular to a top surface of the substrate and exposing a part of the substrate. A first conductive electrode is formed in the first opening. A phase change material layer is formed over a part of the first dielectric layer and covers the first conductive electrode. A second dielectric layer is formed over the first dielectric layer overlying the phase change material layer. A third dielectric layer is formed over the second dielectric layer. A second opening is formed to penetrate the third dielectric layer and the second dielectric layer perpendicular to the top surface of the substrate, and the second opening exposes a part of the phase change material layer. A second conductive electrode is formed in the second opening.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 25:
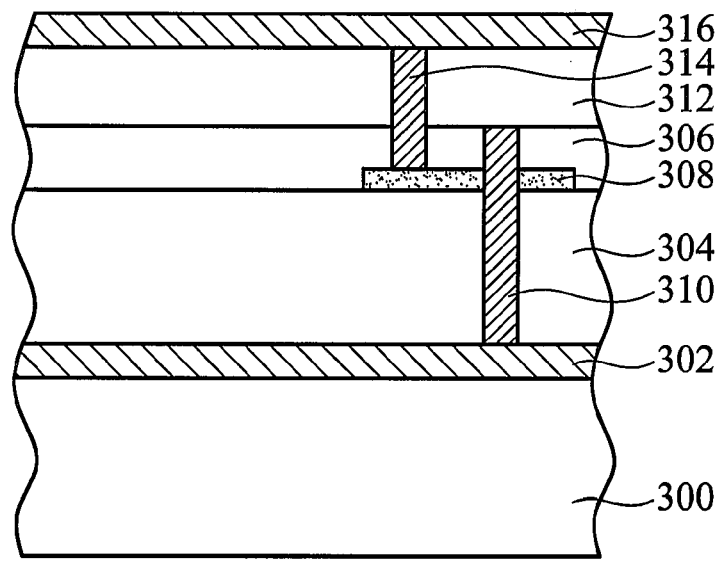
FIGS. 25~27 are schematic diagrams showing a cross section of a passive PCM device of the invention, respectively.
Figure 26:
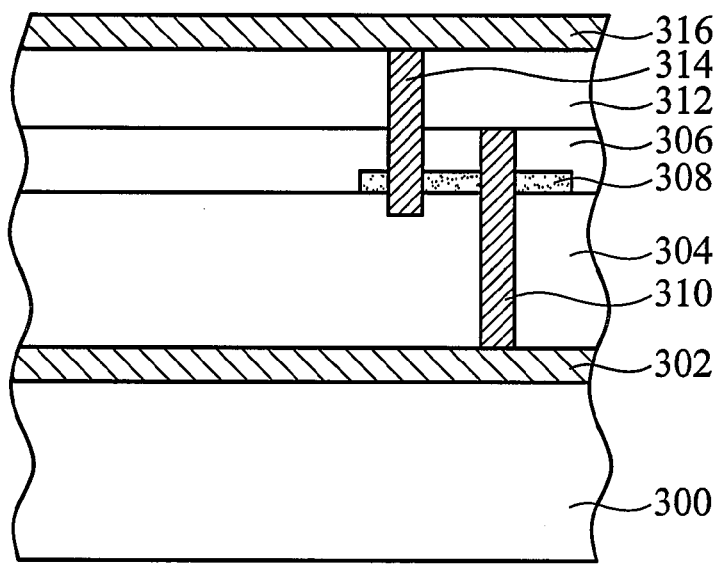
Figure 27:
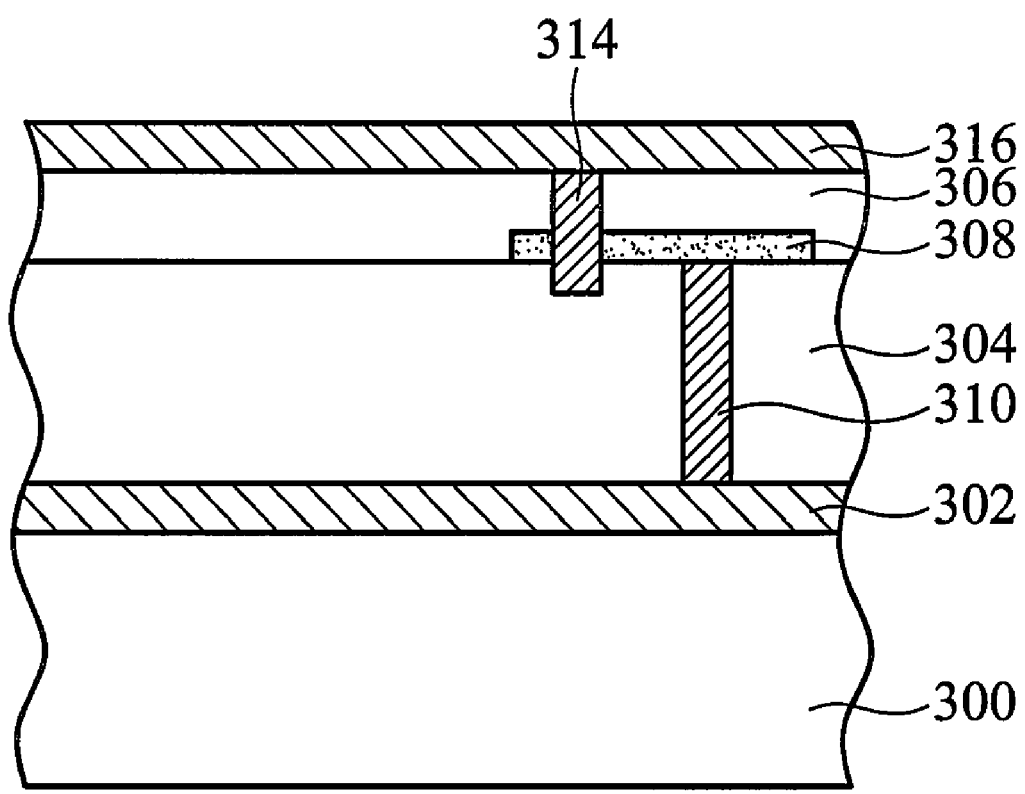

Embodiments of phase change memory devices and methods for manufacturing the same are described as below incorporating FIGS. 3~27, wherein FIGS. 3~11 are schematic diagrams showing fabrication steps in a method for manufacturing a phase change memory device according to a first exemplary embodiment, respectively. FIGS. 12~16 are schematic diagrams showing fabrication steps in a method for manufacturing a phase change memory device according to a second exemplary embodiment, respectively. FIGS. 17~24 are schematic diagrams showing fabrication steps of a method for manufacturing a phase change memory device according to a third exemplary embodiment, respectively. FIGS. 25~27 are schematic diagrams showing fabrication steps of a method for manufacturing a phase change memory device according to a fourth exemplary embodiment.

FIRST EMBODIMENT

Figure 3:
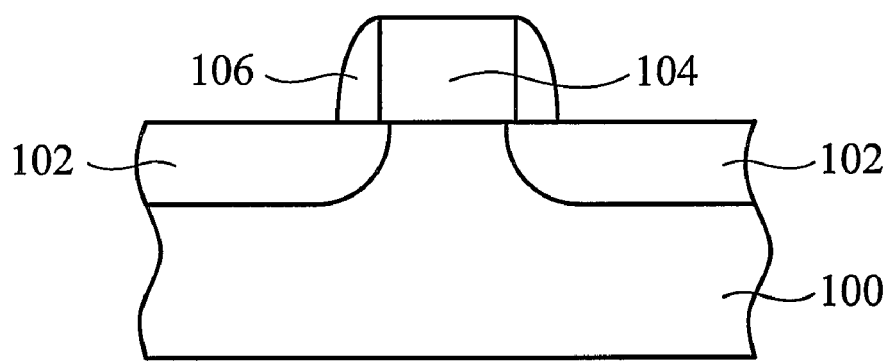
FIGS. 3~8 are schematic diagrams showing different manufacturing steps of a PCM device according to an embodiment of the invention.

In FIG. 3, a substrate 100, for example a silicon semiconductor substrate, is first provided. Herein, an active device, such as a transistor, is also formed over the substrate 100. As shown in FIG. 3, the transistor has a pair of source/drain regions 102 formed in portions of the substrate 100 and a gate structure 104 formed over the portion of the substrate 100 between the source/drain regions 102. As shown in FIG. 3, the gate structure 104 may include a gate dielectric layer and a conductive layer but is merely illustrated as a gate structure 104 here for simplicity. A spacer 106 is disposed over opposing sidewalls of the gate structure 104. The transistor illustrated in FIG. 3 may be a P type or an N type transistor and the source/drain regions 102 may comprise P type or N type impurities depending on the conductivity type of the transistor.

Figure 4:
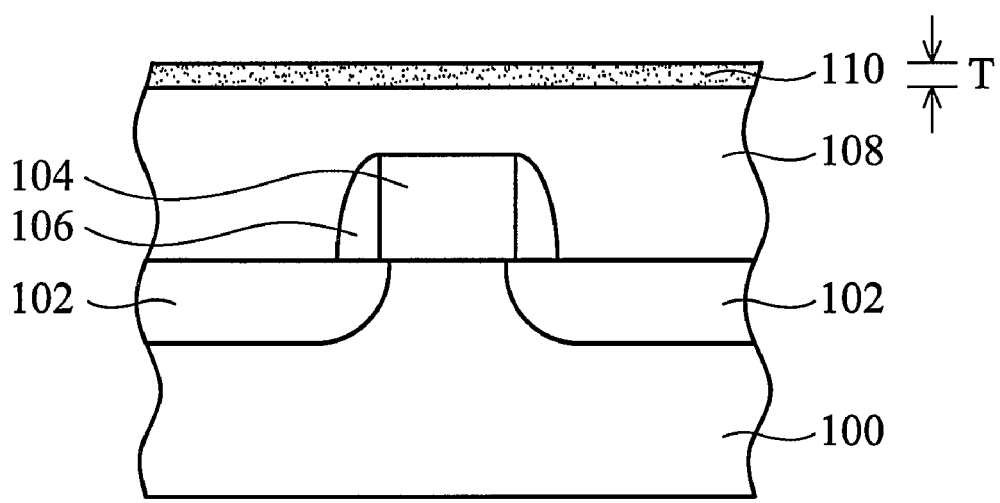

In FIG. 4, a dielectric layer 108 is blanketly formed over the substrate 100, covering the transistor, and a phase change material layer 110 is then blanketly formed over the dielectric layer 108. The dielectric layer 108 may comprise borophosphosilicate glass (BPSG), silicon oxide or spin on glass (SOG), and may be formed by methods such as chemical vapor deposition (CVD) or spin-on techniques. The phase change material layer 110 may comprise chalcogenide materials such as Ge—Sb—Te trinary chalcogenide compound or Ge—Te, Te—Sb binary chalcogenide compounds and can be formed by methods such as CVD or sputtering. Herein, the phase change material layer 110 may have a thickness T of about 50~1000 Å, preferably of about 100~150 Å.

Figure 5:
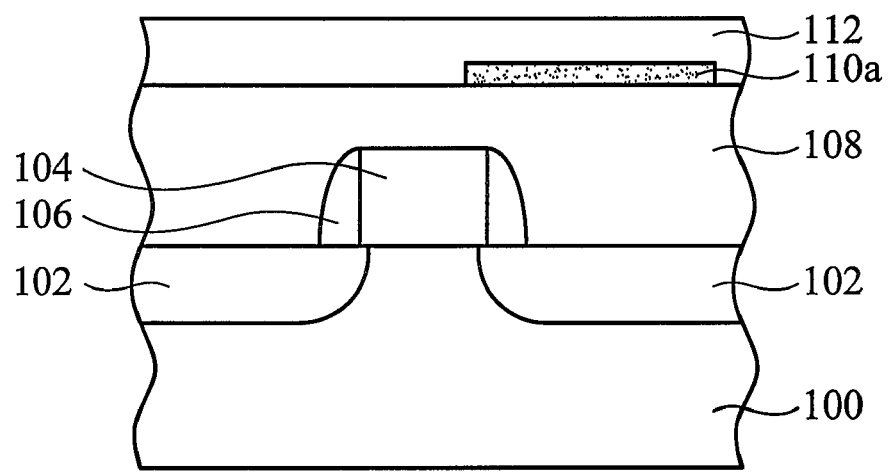

In FIG. 5, a photolithography step and an etching step (both not shown) are sequentially performed through the use of a first photomask (not shown) to pattern the phase change material layer 110, thereby leaving a patterned phase change material layer 110a over a part of the dielectric layer 108. Next, a dielectric layer 112 is formed over the dielectric layer 108 and covers the patterned phase change material layer 110a overlying the dielectric layer 108. The dielectric layer 112 may comprise borophosphosilicate glass (BPSG), silicon oxide or spin on glass (SOG) and can be formed by methods such as chemical vapor deposition (CVD) or spin-on techniques.

Figure 6:
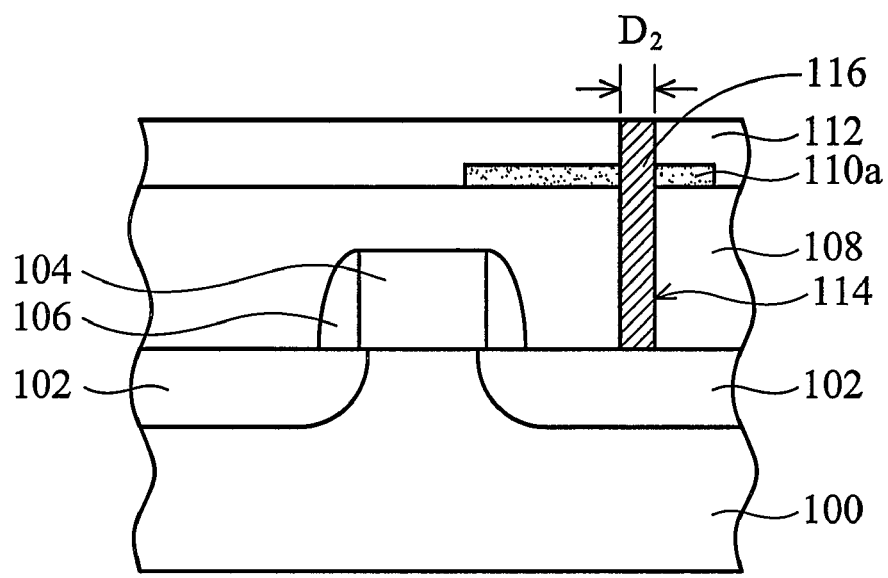

In FIG. 6, a photolithography step and an etching step (not shown) are sequentially performed through the use of a second photomask (not shown) to thereby define the dielectric layer 112, the phase change material layer 110a and the dielectric layer 108, thereby forming an opening 114 in a part of these layers. Herein, the opening 114 sequentially penetrates the dielectric layer 112, the phase change material layer 110a and the dielectric layer 108 perpendicular to a top surface of the substrate 100, thereby exposing a part of the substrate 100. In some embodiments, the opening 104 may be substantially formed over one of the source/drain region 102 and expose a portion of a top surface of the source/drain region 102. A layer of conductive material (not shown) is then formed over the dielectric layer 112 and fills the opening 114. The portion of the conductive material formed above the dielectric layer 112 is then removed by a sequential planarization step (not shown), thereby leaving a conductive electrode 116 in the opening 114. The conductive electrode 116 may comprise conductive materials such as Al, Ti, TiN or W, having a diameter $D_2$. A diffusion barrier layer (not shown) can be further formed between the conductive electrode 116 and the dielectric layers 112, 108 and substrate 100 adjacent thereto, thereby preventing ions of the conductive materials of the conductive electrode 116 from diffusing into adjacent layers.

Figure 7:
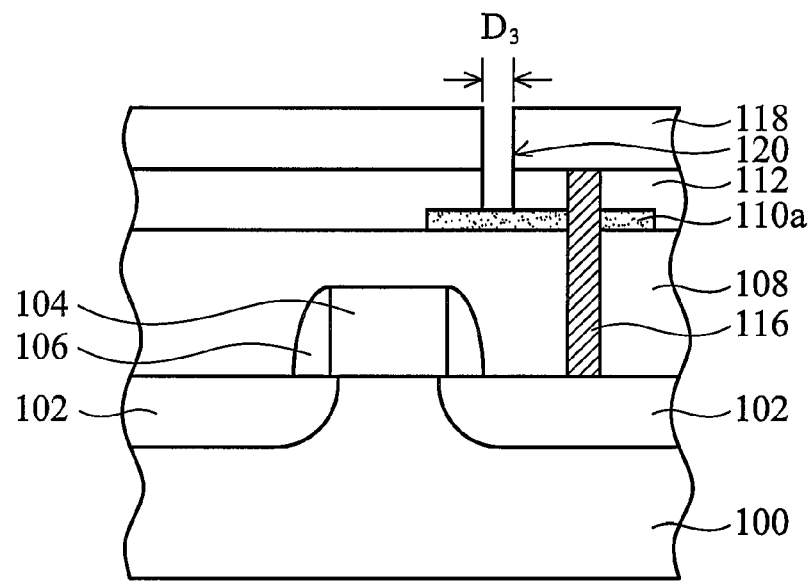

In FIG. 7, a dielectric layer 118 is next formed over the dielectric layer 112, covering the dielectric layer 112 and the conductive electrode 116. Next, a photolithography step and an etching step (both not shown) are sequentially performed through the use of a third photomask (not shown) to thereby form an opening 120 in the dielectric layers 118 and 112. As shown in FIG. 7, the opening 120 passes through the dielectric layers 118 and 112 perpendicular to a top surface of the substrate 100 and stops on phase change material layer 110a, thereby exposing a part of the phase change material layer 110a. Herein, the opening 120 is formed with a circular configuration (not shown in FIG. 7 but shown in FIG. 9), having a diameter $D_3$.

Figure 8:
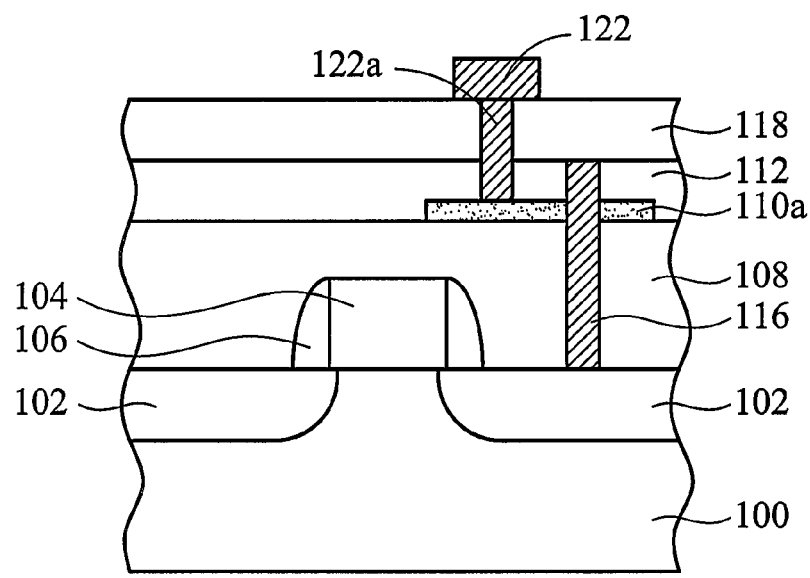

In FIG. 8, a layer of conductive material is next formed over the dielectric layer 118 and fills the opening 120. The portion of the conductive material above the dielectric layer is then removed by a sequential planarization step (not shown), thereby leaving a conductive layer 122a in the opening 120. The conductive layer 122a fills the opening 120 and may function as a conductive electrode which sequentially penetrates downward through the dielectric layers 118 and 112 and connects the phase change material layer 110a. The conductive electrode 122a may comprise conductive materials such as Al, Ti, TiN or W, having a diameter $D_3$. A diffusion barrier layer (not shown) may be further formed between the conductive electrode 122a and the dielectric layers 118, 112 and the phase change material layer 110a adjacent thereto, thereby preventing ions in the conductive materials of the conductive electrode 122a from diffusing into adjacent layers.

Next, a layer of conductive material is blanketly formed over the dielectric layer 118. A photolithography step and an etching step are sequentially performed on the conductive material incorporating a fourth photomask (not shown), thereby forming a patterned conductive layer 122 over a part of the dielectric layer 118. The conductive layer 122 may comprise conductive materials such as Al, Ti, TiN or W. Herein, the conductive layer 122 substantially covers the conductive electrode 122a formed in the underlying dielectric layers to connect the conductive electrode 122a.

Figure 9:
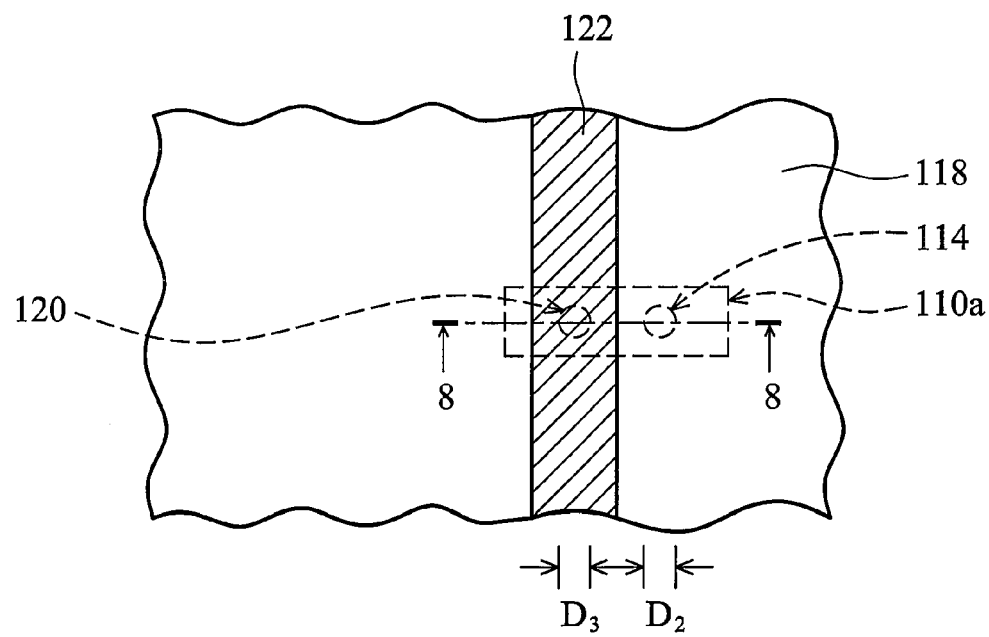
FIGS. 9-11 are schematic diagrams showing a top view of a PCM device of the invention, respectively.

FIG. 9 is a schematic diagram showing a top view of the structure illustrated in FIG. 8 and FIG. 8 illustrates a cross section taken along line 8-8 in FIG. 9. As shown in FIG. 9, the openings 120 and 114 are now formed with a circular configuration and have similar diameters ($D_3$ substantially equals to $D_2$). The conductive electrodes formed in these openings fully overlap the phase change material layer 110a. Herein, the conductive electrode formed in the opening 114 may function as a heating electrode and the portion of the circumstance surface of the conductive electrode penetrating the phase change material layer 110a (see FIG. 8) is now fully surrounded by the phase change material layer 110a, having a contact area of about $\pi D_2 T$ therebetween.

Assuming the phase change material layer 110a has a thickness T of about 10 nm and the conductive electrode formed in the opening 114 has a diameter $D_2$ of about 100 nm, a contact area of about $1000\pi$ nm² between the phase change material layer 110a and a conductive electrode is provided. Compared with the conventional phase change memory cell illustrated in FIGS. 1 and 2, the conventional memory cell structure may have a contact area of about $\pi D_1^2/4$ between the phase change material layer 20 and the heating electrode 16 and a contact area of about $2500\pi$ therebetween is provided while $D_1$ is 100 nm.

Thus, a contact area between the phase change material layer and the heating electrode in a phase change memory device of the invention is only about 0.4 times that in the conventional phase change memory device while using a heating electrode with similar diameter. An increased current density can be thus provided to the phase change material layer due to reduction of the contact area. Additionally, the current density provided to the phase change material layer in the invention can be controlled by adjusting a thickness of the phase change material layer, thereby solving issues of reduction of a heating electrode restricted by photolithography capability in conventional phase change memory cell manufacturing.

Figure 10:
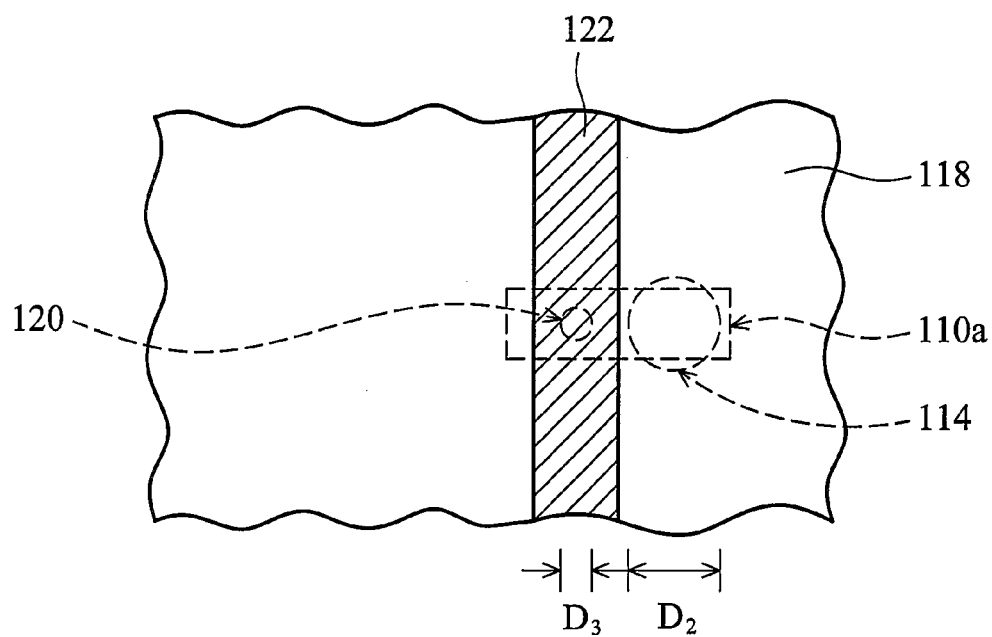

FIG. 10 is a schematic diagram illustrating another top view of the conductive electrodes formed in the openings 120 and 114. As shown in FIG. 10, the opening 114 is formed with a diameter $D_2$ larger than the diameter $D_3$ of the opening 120. The opening 114 is also larger than a width of the phase change material layer 110a. Thus, the conductive electrode formed in the opening 114 has a dimension larger than that formed in the opening 120 and the conductive electrode formed in the opening 114 not only penetrates the phase change material layer but also penetrates portions of the dielectric layers (e.g. the dielectric layers 108 and 112) adjacent to the phase change material layer 110a.

Figure 11:
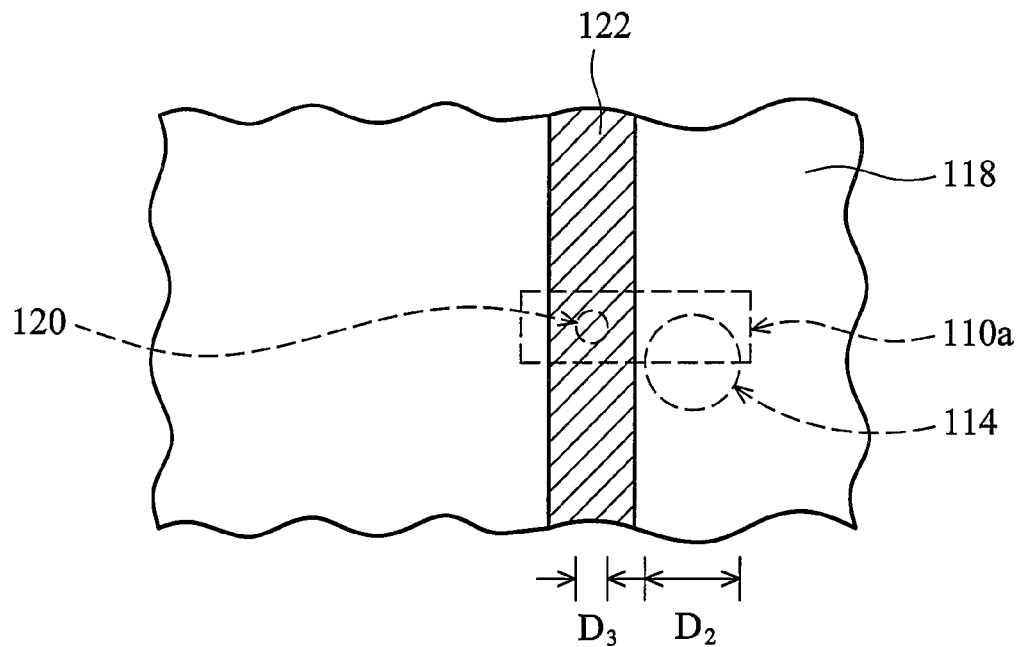

FIG. 11 is a schematic diagram illustrating another top view of the conductive electrodes formed in the openings 120 and 114. As shown in FIG. 11, the position of the opening 114 is shifted and a circumstance of the conductive electrode formed in the opening 114 contacting the phase change material layer is not fully surrounded by the phase change materially layer 110a. Portions of the circumstance of the portion of the conductive electrode formed in the opening 114 penetrating the phase change material layer 110a are now surrounded by the adjacent dielectric layers. The conductive electrode formed in the opening 114 now merely penetrates portions of the phase change material layer 110a.

Accordingly, the phase change memory device in the first embodiment can be taken as an active phase change memory device applied with an active device such as a transistor. In the first embodiment, the phase change memory cell structure therein can be formed through the uses of four photomasks, thereby having an advantage of easily fabrication. In this embodiment, the active device is not restricted to the transistor illustrated and can be other active devices such as a diode.

SECOND EMBODIMENT

Figure 12:
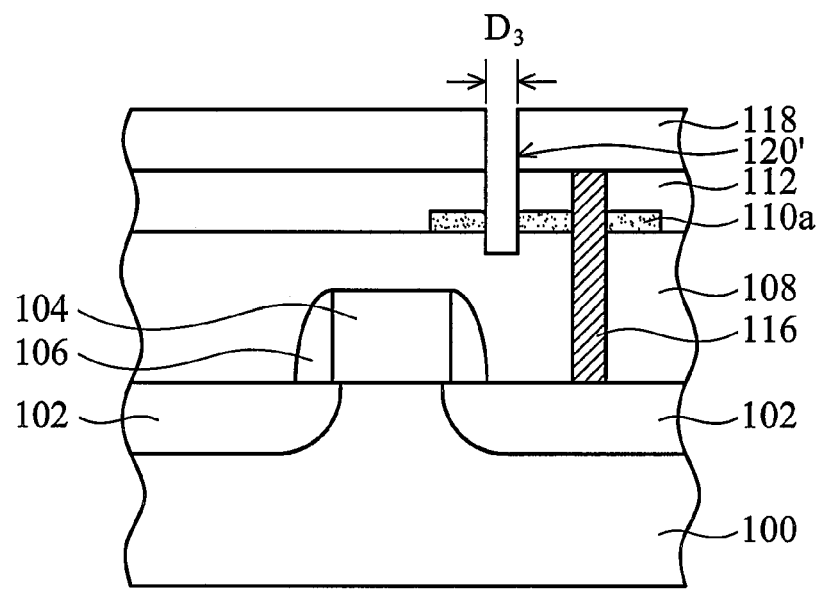
FIGS. 12~13 are schematic diagrams showing different manufacturing steps of a PCM device according to another embodiment of the invention.

FIGS. 12~16 are schematic diagrams showing different fabrication steps of a method for manufacturing a phase change memory device according to a second embodiment of the invention, respectively. In FIG. 12, a semiconductor structure as illustrated in FIG. 6 of the first embodiment is first provided through fabrications as that illustrated in FIGS. 3-6. Next, a dielectric layer 118 is blanketly formed over the dielectric layer 112 and the conductive electrode 116. A photolithography step and an etching step (both not shown) are then performed to form an opening 120' in the dielectric layer 118 and 112 through the use of a photomask (not shown). As shown in FIG. 12, the opening 120' is perpendicular to a surface of the substrate 100 and extends through the dielectric layer 118, the dielectric layer 112 and portions of the dielectric layer 108, thereby penetrating portions of the phase change material layer 110a. Herein, the opening 120' may have a circular configuration (shown in FIG. 14 but not shown in FIG. 12), having a diameter D3.

Figure 13:
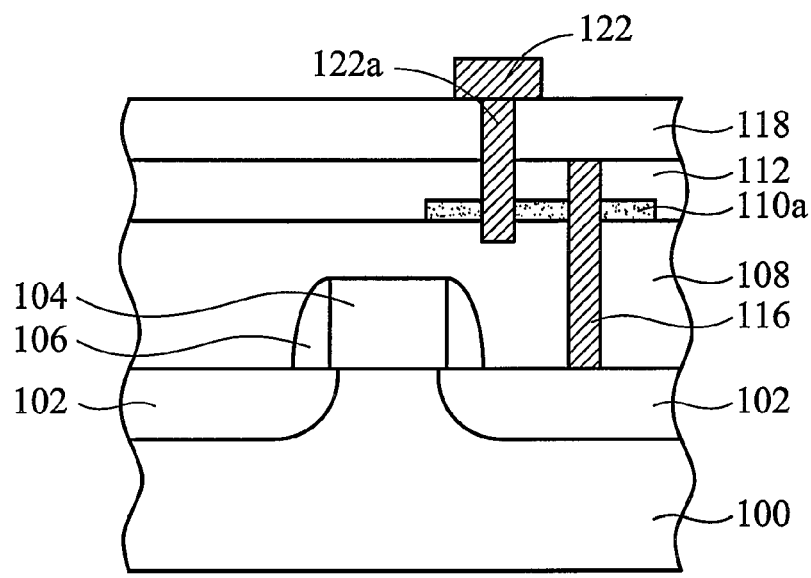

As shown in FIG. 13, a layer of conductive material is next formed over the dielectric layer 118 and fills the opening 120'. The portion of the layer of conductive material above the dielectric layer 118 is then removed, thereby leaving a conductive layer 122a in the opening 120'. The conductive layer 122a fills the opening 120' and forms a conductive electrode penetrating downward through dielectric layers 118 and 112, thereby connecting the phase change material layer 110a. The conductive electrode 122a may comprise conductive material such as Al, Ti, TiN or W and has a diameter $D_3$. A diffusion barrier layer (not shown) can be further formed between the conductive electrode 122a and the dielectric layer 118, the dielectric layer 112 and the phase change material layer 110a adjacent thereto, thereby preventing ions in the conductive materials of the conductive electrode 122a from diffusing into adjacent layers.

Next, a layer of conductive material (not shown) is blanketly formed over the dielectric layer 118. A photolithography step and an etching step (both not shown) are sequentially performed to the layer of conductive material through the use of a photomask (not shown), thereby forming a patterned conductive layer 122 over a part of the dielectric layer 118. The conductive layer 122 may comprise conductive materials such as Al, Ti, TiN or W. Herein, the conductive layer 122 substantially covers the conductive electrode 122a formed in the underlying dielectric layer and connects the conductive electrode 122a.

Figure 14:
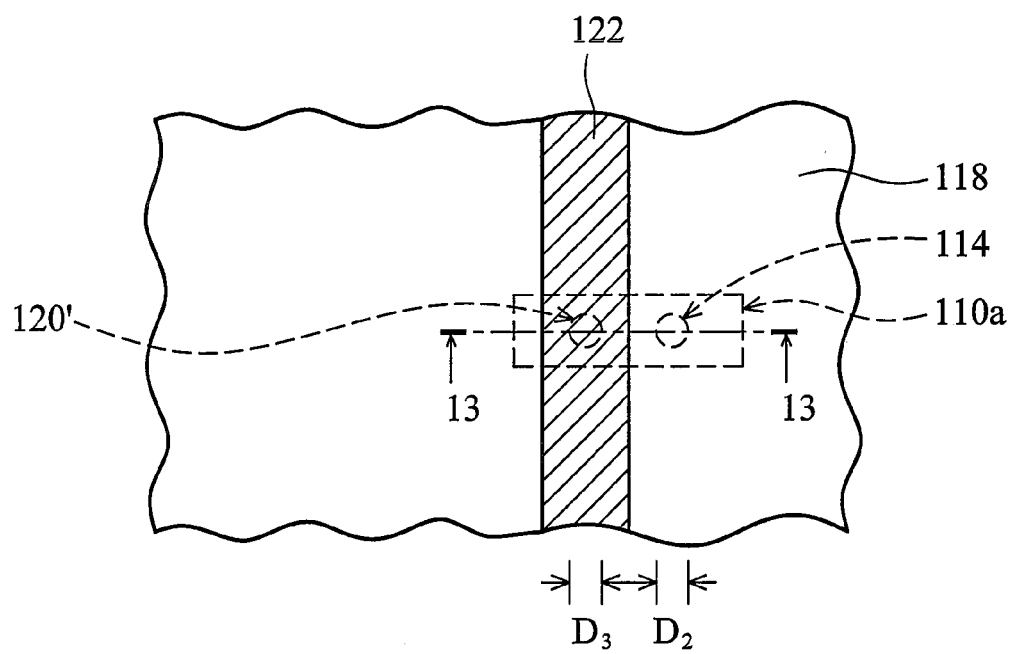
FIGS. 14-16 are schematic diagrams showing a top view of a PCM device of the invention, respectively.

FIG. 14 is a schematic diagram showing a top view of the structure illustrated in FIG. 13 and FIG. 13 illustrates a cross section taken along line 13-13 in FIG. 14. As shown in FIG. 14, the openings 120' and 114 are now both formed with a circular configuration and in a similar diameter ($D_3$ substantially equals to $D_2$). The conductive electrodes formed in these openings substantially fully overlap the phase change material layer 110a. At this time, the conductive electrode formed in the opening 114 may function as a heating electrode and the circumstance surface of the part of the conductive electrode penetrating the phase change material layer 110a is fully surrounded by the phase change material layer, having a contact area of about $\pi D_2 T$.

Figure 15:
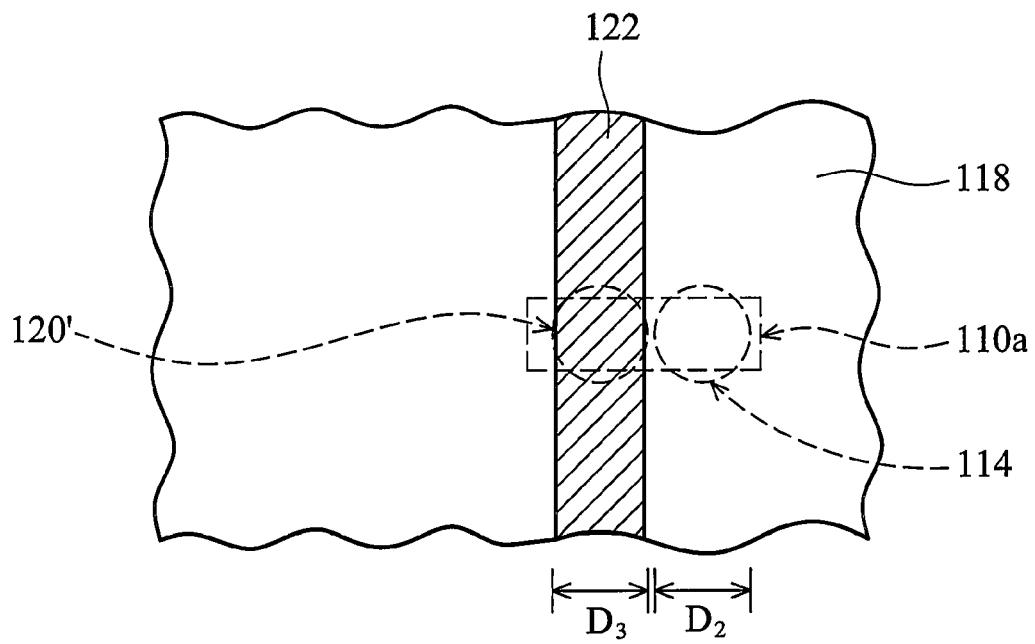

FIG. 15 is another schematic diagram showing a top view of the conductive electrodes formed in the openings 120' and 114. As shown in FIG. 15, the opening 114 is formed with a diameter $D_2$ similar to the diameter $D_3$ of the opening 120 but both thereof are larger than a width of the phase change material layer 110a. Thus, the conductive electrode formed in the openings 114 and 120' not only penetrates the phase change material layer but also penetrates portions of the dielectric layers (e.g. the dielectric layers 108, 112 and 118) adjacent to the phase change material layer 110a.

Figure 16:
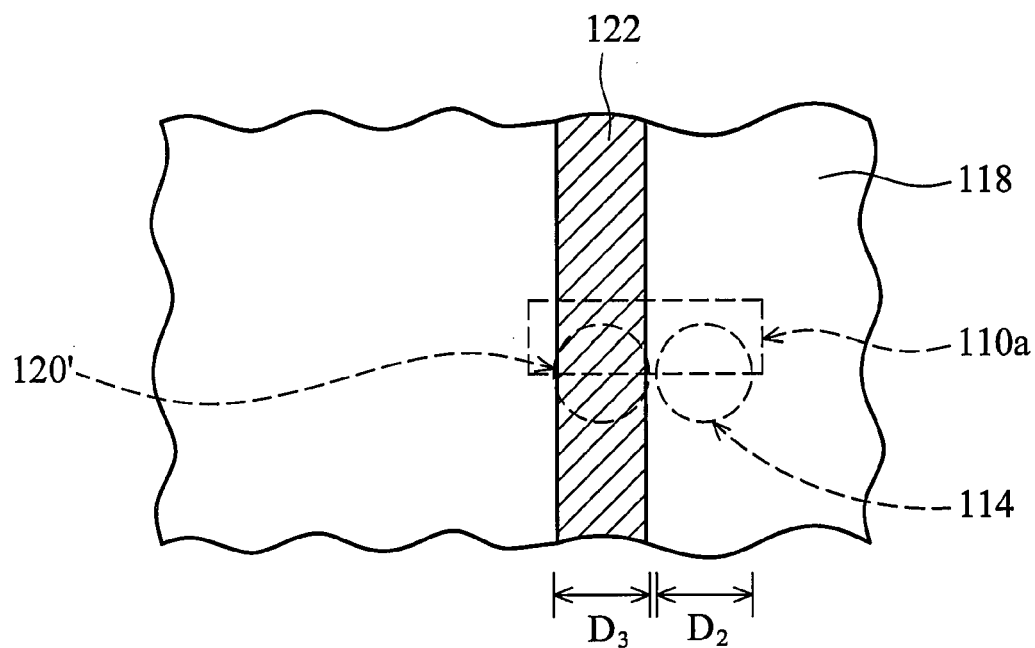

FIG. 16 is a schematic diagram showing another configuration of the conductive electrodes formed in the openings 120' and 114. At this time, the opening 114 is formed with a diameter $D_2$ similar to the diameter $D_3$ of the opening 120' however positions of the openings 114, 120' are shifted, portions of the circumstance of the conductive electrode formed in the openings 114 and 120' penetrating the phase change material layer are partially surrounded by the phase change materially layer 110a and portions of the circumstance thereof is also surrounded by the adjacent dielectric layers. The conductive electrodes formed in the openings 114 and 120' merely penetrate portions of the phase change material layer 110a.

As shown by the embodiment, a contact area between the phase change material layer and the heating electrode in a phase change memory device of the second embodiment can be further reduced compared to the conventional phase change material cell while using a heating electrode of similar diameter. An increased current density can be thus provided to the phase change material layer due to reduction of the contact area. Additionally, the current density provided to the phase change material layer in this embodiment can be controlled by adjusting a thickness of the phase change material layer, thereby solving issues of reduction of a heating electrode restricted by photolithography capability in conventional phase change memory cell manufacturing.

THIRD EMBODIMENT

Figure 17:
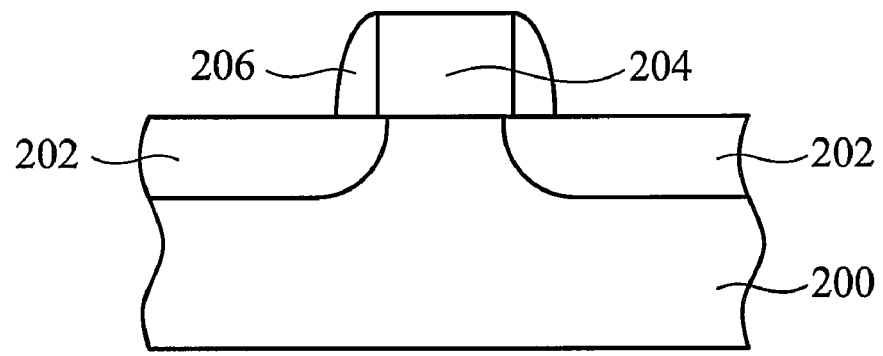
FIGS. 17~21 are schematic diagrams showing different manufacturing steps of a PCM device according to another embodiment of the invention.

FIGS. 17~24 are schematic diagrams showing different fabrication steps of a method for manufacturing a phase change memory device according to a third embodiment of the invention, respectively. In FIG. 17, a substrate 200, for example a silicon semiconductor substrate, is first provided. Herein, an active device, such as a transistor, is also formed over the substrate 200. As shown in FIG. 17, the transistor has a pair of source/drain regions 202 formed in portions of the substrate 200 and a gate structure 204 formed over the portion of the substrate 200 between the source/drain regions 202. As shown in FIG. 14, the gate structure 204 may include a gate dielectric layer and a conductive layer but is merely illustrated as a gate structure 204 here for simplicity. A spacer 206 is disposed over opposing sidewalls of the gate structure 104. The transistor illustrated in FIG. 17 may be a P type or an N type transistor and the source/drain regions 202 may comprise P type or N type impurities depending on the conductivity type of the transistor.

Figure 18:
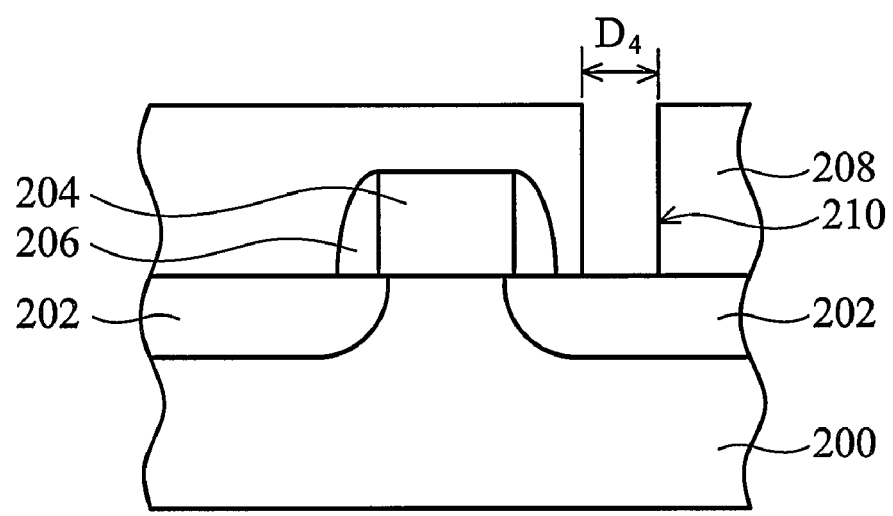

In FIG. 18, a dielectric layer 208 is blanketly formed over the substrate 100, covering the transistor. The dielectric layer 208 may comprise borophosphosilicate glass (BPSG), silicon oxide or spin on glass (SOG), and may be formed by methods such as chemical vapor deposition (CVD) or spin-on techniques. A photolithography step and an etching step (both not shown) are sequentially performed through the use of a first photomask (not shown) to pattern the dielectric layer 208, thereby forming an opening 210 in a part of the dielectric layer 208. Herein, the opening 210 penetrates the dielectric layer 208, perpendicular to a top surface of the substrate 200, thereby exposing a part of the substrate 200. In some embodiments, the opening 210 may be formed in a circular configuration and having a diameter $D_4$. In some embodiments, the opening 210 is substantially formed over one of the source/drain regions 202, exposing a portion of a top surface of the source/drain region 202.

Figure 19:
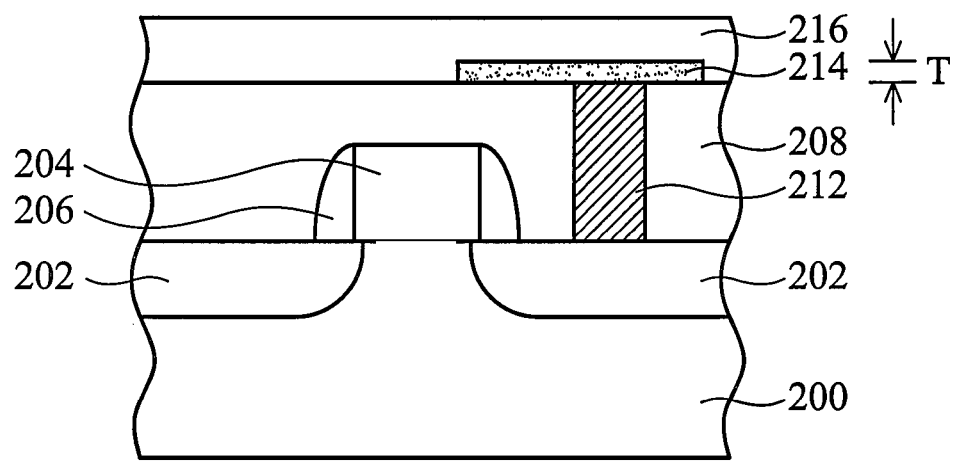

In FIG. 19, a layer of conductive material (not shown) is then formed over the dielectric layer 208 and fills the opening 210. The portion of the conductive material formed above the dielectric layer 208 is then removed by a sequential planarization step (not shown), thereby leaving a conductive electrode 212 in the opening 210. The conductive electrode 212 may comprise conductive materials such as Al, Ti, TiN or W, having a diameter $D_4$. A diffusion barrier layer (not shown) can be further formed between the conductive electrode 212 and the dielectric layer 208 and substrate 100 adjacent thereto, thereby preventing ions of the conductive materials of the conductive electrode 212 from diffusing into adjacent layers. A layer of phase change material is next blanketly formed over the dielectric layer 208 and the conductive electrode 212. The layer of the phase change material layer may comprise chalcogenide materials such as Ge—Sb—Te trinary chalcogenide compound or Ge—Te, Te—Sb binary chalcogenide compounds and can be formed by methods such as CVD or sputtering. Herein, the layer of phase change material may have a thickness T of about 50~1000 Å, preferably of about 100~150 Å. Next, a photolithography step and an etching step (both not shown) are sequentially performed through the use of a second photomask (not shown) to pattern the layer of the phase change material, thereby leaving a patterned phase change material layer 214 over a part of the dielectric layer 208, substantially covering the conductive electrode 212. Next, a dielectric layer 216 is formed over the dielectric layer 108 and covers the patterned phase change material layer 214 overlying the dielectric layer 208. The dielectric layer 216 may comprise borophosphosilicate glass (BPSG), silicon oxide or spin on glass (SOG) and can be formed by methods such as chemical vapor deposition (CVD) or spin-on techniques.

Figure 20:
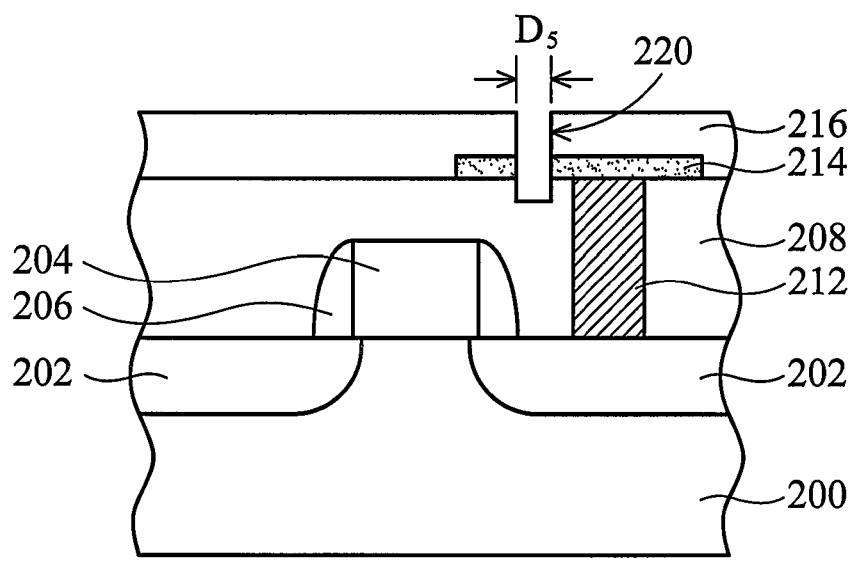

As shown in FIG. 20, a photolithography step and an etching step (not shown) are sequentially performed through the use of a third photomask (not shown) to thereby define the dielectric layer 216, the phase change material layer 214 and the dielectric layer 208, thereby forming an opening 220 in a part of these layers. Herein, the opening 220 sequentially penetrates the dielectric layer 216, the phase change material layer 214 and portions of the dielectric layer 208 perpendicular to a top surface of the substrate 200, thereby laterally exposing a part of the phase change material layer 214. In some embodiments, the opening 220 may be formed in a circular configuration (not shown in FIG. 20 but shown in FIG. 22), having a diameter $D_5$.

Figure 21:
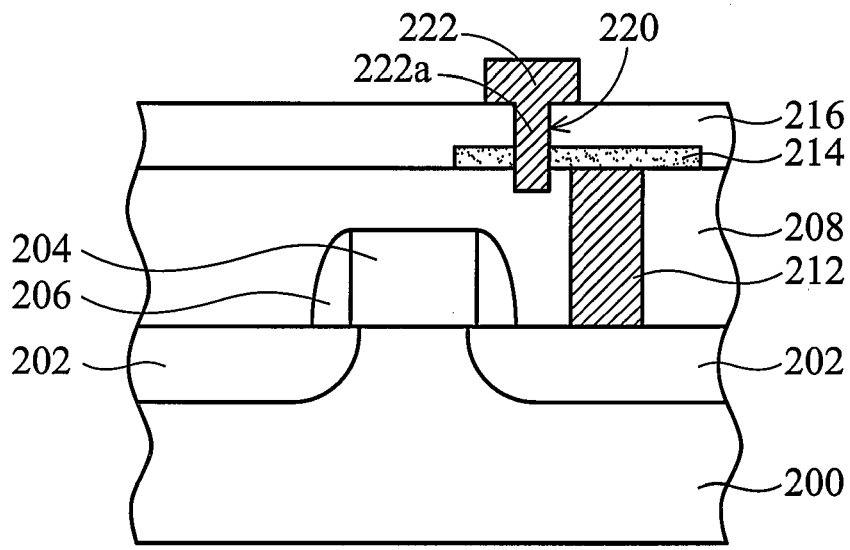

In FIG. 21, a layer of conductive material (not shown) is then formed over the dielectric layer 216 and fills the opening 220. The portion of the conductive material formed above the dielectric layer 216 is then removed by a sequential planarization step (not shown), thereby leaving a conductive electrode 222a in the opening 220. The conductive electrode 222a may comprise conductive materials such as Al, Ti, TiN or W, having a diameter $D_5$. A diffusion barrier layer (not shown) can be further formed between the conductive electrode 222a and the dielectric layers 216, 208 and phase change material layer 214 adjacent thereto, thereby preventing ions of the conductive materials of the conductive electrode 222a from diffusing into adjacent layers.

Next, a layer of conductive material is blanketly formed over the dielectric layer 216. A photolithography step and an etching step are sequentially performed to the conductive material incorporating a fourth photomask (not shown), thereby forming a patterned conductive layer 222 over a part of the dielectric layer 216. The conductive layer 222 may comprise conductive materials such as Al, Ti, TiN or W. Herein, the conductive layer 222 substantially covers the conductive electrode 222a formed in the underlying dielectric layers to connect the conductive electrode 222a.

Figure 22:
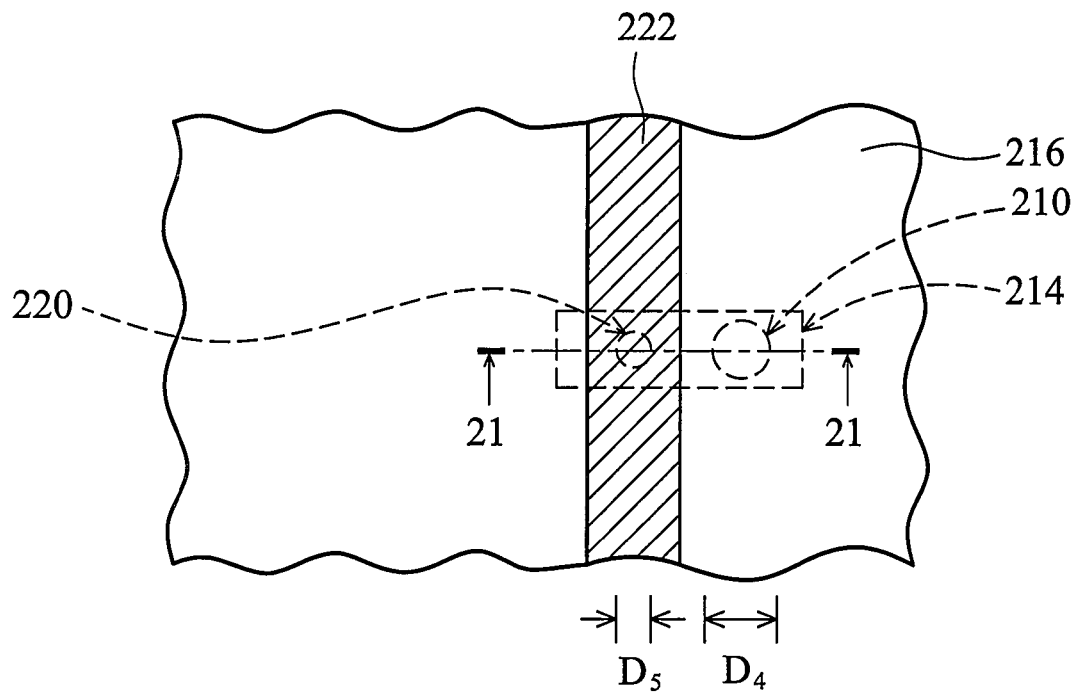
FIGS. 22-24 are schematic diagrams showing a top view of a PCM device of the invention, respectively.

FIG. 22 is a schematic diagram showing a top view of the structure illustrated in FIG. 21 and FIG. 21 illustrates a cross section taken along line 21-21 in FIG. 22. As shown in FIG. 22, the openings 220 and 210 are now formed with a circular configuration and have different diameters ($D_4$ substantially larger than $D_5$). The conductive electrodes formed in these openings fully overlap the phase change material layer 214. Herein, the conductive electrode formed in the opening 220 may function as a heating electrode and the portion of the circumstance surface of the conductive electrode penetrating the phase change material layer 214 (see FIG. 21) is now fully surrounded by the phase change material layer 214, having a contact area of about $\pi D_5 T$ therebetween.

Figure 23:
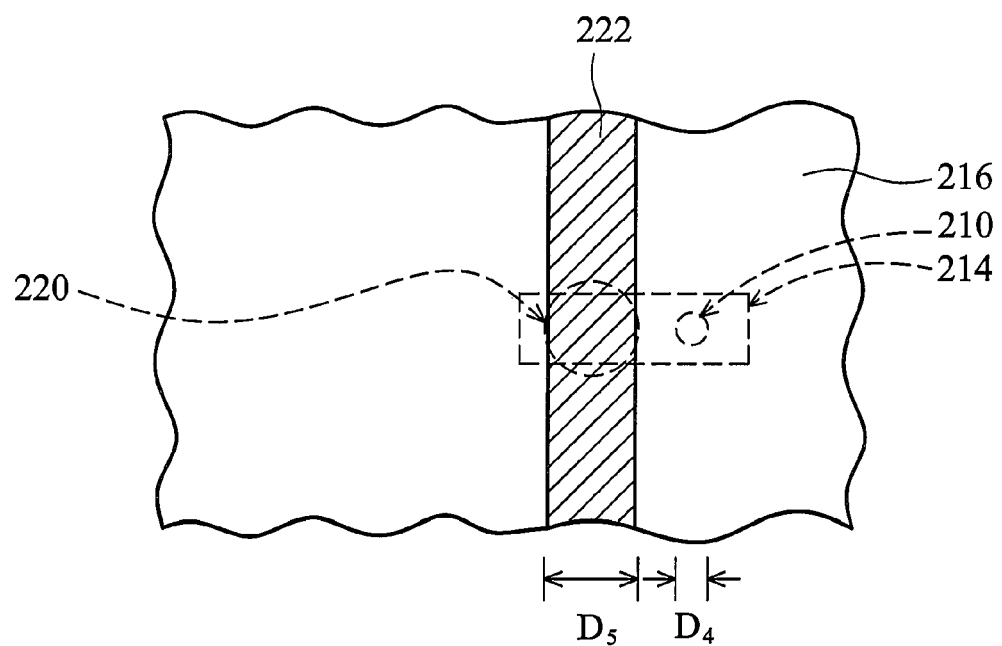

FIG. 23 is a schematic diagram illustrating another top view of the conductive electrodes formed in the openings 210 and 220. As shown in FIG. 23, the opening 220 is formed with a diameter $D_5$ larger than the diameter $D_4$ of the opening 210. The diameter $D_5$ of the opening 220 is also larger than a width of the phase change material layer 214. Thus, the conductive electrode formed in the opening 220 has a dimension larger than that formed in the opening 210 and the conductive electrode formed in the opening 220 now not only fully penetrates the phase change material layer but also penetrates portions of the dielectric layers (e.g. the dielectric layers 216 and 208) adjacent to the phase change material layer 214.

Figure 24:
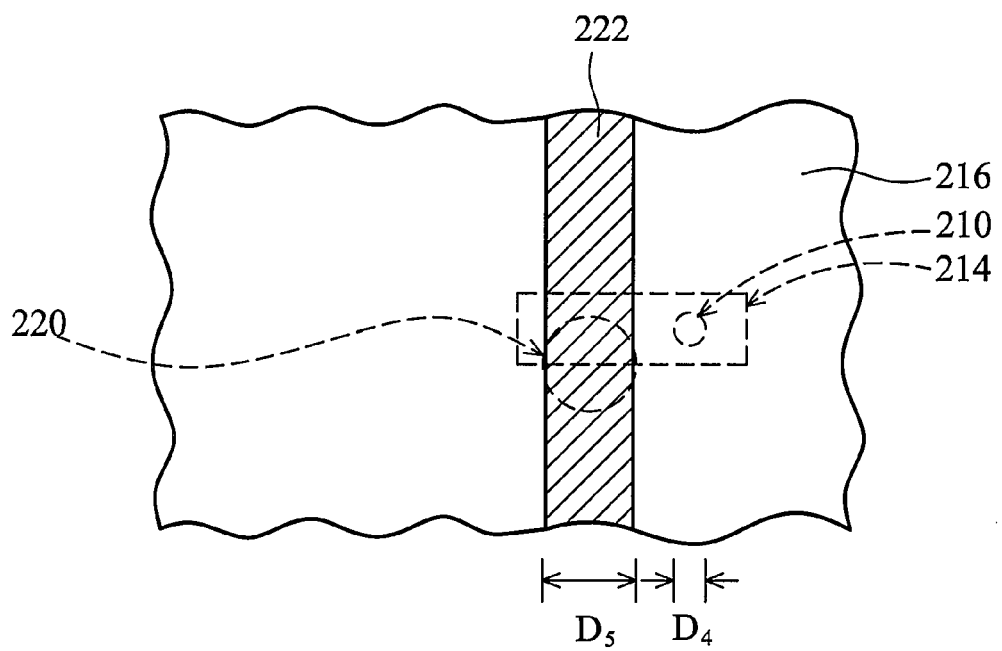

FIG. 24 is a schematic diagram illustrating another top view of the conductive electrodes formed in the openings 210 and 220. As shown in FIG. 24, the position of the opening 220 is shifted and a circumstance of the conductive electrode formed in the opening 220 contacting the phase change material layer is not fully surrounded by the phase change materially layer 214. Portions of the circumstance of the portion of the conductive electrode formed in the opening 220 penetrating the phase change material layer 214 are now surrounded by the adjacent dielectric layers. The conductive electrode formed in the opening 220 now merely penetrates portions of the phase change material layer 214.

Figure 1:
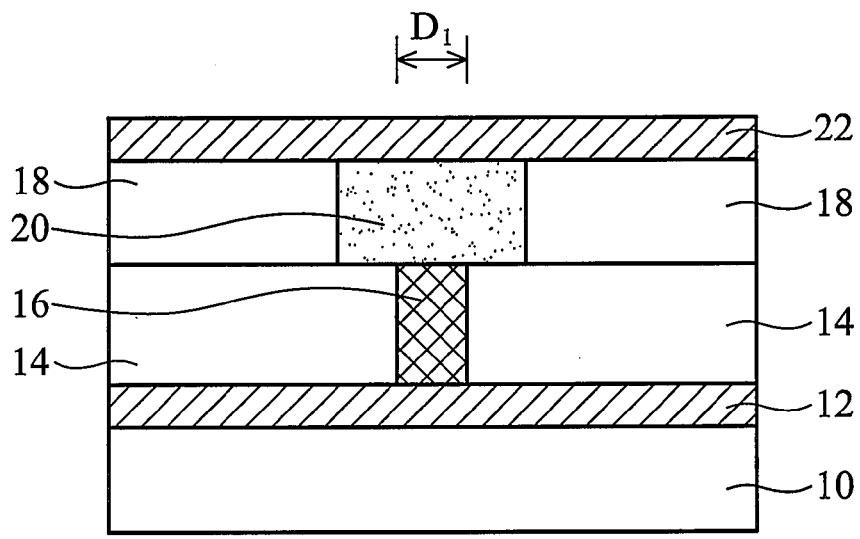
FIG. 1 is a schematic diagram showing a cross section of a conventional phase change memory cell.
Figure 2:
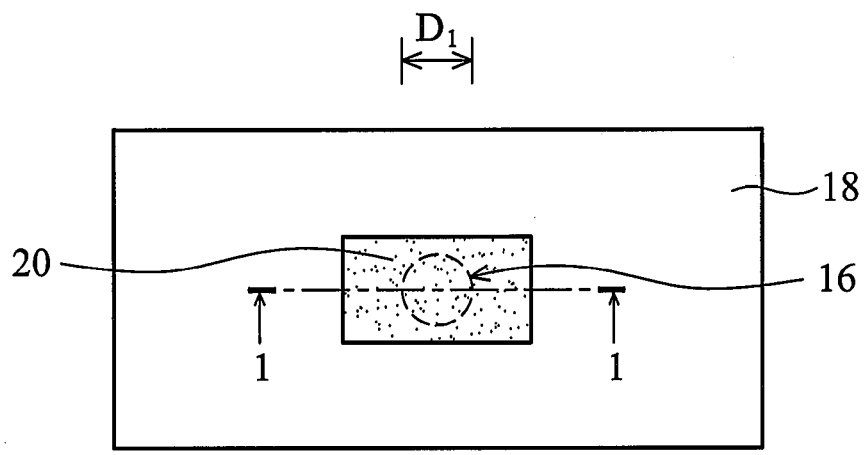
FIG. 2 is a schematic showing a schematic top view of the conventional PCM cell of FIG. 1.

As shown by the embodiment, a contact area between the phase change material layer and the heating electrode in a phase change memory device of the third embodiment can be further reduced compared to the conventional phase change material cell illustrated in FIG. 1 while using a heating electrode of similar diameter. An increased current density can be thus provided to the phase change material layer due to reduction of the contact area. Additionally, the current density provided to the phase change material layer in this embodiment can be controlled by adjusting a thickness of the phase change material layer, thereby solving issues of reduction of a heating electrode restricted by photolithography capability in conventional phase change memory cell manufacturing.

FOURTH EMBODIMENT

The first, second and third embodiments as disclosed are exemplary embodiments showing a phase change memory device having an active device formed therein but the phase change memory device of the invention is not limited thereto. The phase change memory device of the invention can be formed as a passive phase change memory device without active devices formed therein, as illustrated in FIGS. 25-27.

FIG. 25 is a schematic diagram showing a cross section of a phase change memory device, comprising a substrate 300, a conductive layer 302 formed over the substrate 300, a plurality of dielectric layers 304, 306 and 312 sequentially formed over the conductive layer 302, and a conductive layer 316 formed over the dielectric layer 312.

As shown in FIG. 25, a conductive electrode 310 is disposed in the dielectric layers 304 and 306, a phase change material layer 308 is disposed in the dielectric layer 306, and a conductive electrode 314 is disposed in the dielectric layers 306 and 312. The conductive electrode 310 now penetrates a part of the phase change material layer 308 and electrically connects the conductive layer 302 and the phase change material layer 308. The conductive electrode 314 electrically connects the conductive layer 316 and the phase change material layer 308. Fabrication of the conductive electrodes 314 and 310, and the phase change material layer 308 can be achieved by fabrications illustrated in FIGS. 3-8. Configurations of the conductive electrodes 314 and 310, and the phase change material layer 308 maybe the same as those illustrated in FIGS. 9-11. Herein, the conductive electrode 310 functions as a heating electrode and the conductive layer 302 is formed over the substrate prior to formation of the dielectric layer 304. Fabrications of the conductive layer 316 and the conductive electrode 314 maybe the same as fabrication illustrated in FIGS. 7-8.

Moreover, FIG. 26 illustrates another configuration of the phase change memory device according to another embodiment of the invention. In this embodiment, the conductive electrodes 314 and 310 respectively penetrates a part of the phase change material layer 308 either downward or upward, both thereof functioning as heating electrodes. Fabrication of the conductive electrodes 314 and 310 and phase change material layer 308 can be achieved by fabrication illustrated in FIGS. 12 and 13 and may have configurations as those illustrated in FIGS. 14-16.

In addition, FIG. 27 illustrates yet another configuration of the phase change memory device according to another embodiment of the invention, having two conductive electrodes 314 and 310 therein. In this embodiment, the conductive electrode 314 penetrates a part of the phase change material layer 308 downward and functions as a heating electrode. Fabrication of the conductive electrodes 314 and 310 and phase change material layer 308 can be achieved by fabrication illustrated in FIGS. 17-21 and may have configurations as those illustrated in FIGS. 22-24.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
   a substrate;
   a dielectric layer formed over the substrate;
   a phase change material layer embedded in the dielectric layer; and
   a first conductive electrode embedded in the dielectric layer, penetrating the phase change material layer and extending perpendicular to a top surface of the dielectric layer.

2. The phase change memory device as claimed in claim 1, wherein the phase change material layer surrounds a part of the first conductive electrode along a circumstance of the first conductive electrode.

3. The phase change memory device as claimed in claim 1, wherein the phase change material layer comprises chalcogenide materials.

4. The phase change memory device as claimed in claim 1, wherein phase change material layer is disposed in the dielectric layer and extends in the dielectric layer along a direction horizontal to a top surface of the dielectric layer.

5. The phase change memory device as claimed in claim 1, further comprising a first conductive layer disposed between the substrate and the dielectric layer, wherein the first conductive electrode connects the first conductive layer.

6. The phase change memory device as claimed in claim 5, further comprising a second conductive layer disposed over the dielectric layer to electrically connect the phase change material layer.

7. The phase change memory device as claimed in claim 6, further comprising a second conductive electrode disposed in the dielectric layer to electrically connect the phase change material layer and the second conductive layer.

8. The phase change memory device as claimed in claim 1, further comprising an active device disposed over the substrate and covered by dielectric layer, wherein the first conductive electrode connects the active device.

9. The phase change memory device as claimed in claim 8, wherein the active device is a transistor and the first conductive electrode connects a source/drain region of the transistor.

10. The phase change memory device as claimed in claim 9, further comprising a conductive layer disposed over the dielectric layer to electrically connect the phase change material layer.

11. The phase change memory device as claimed in claim 6, further comprising a second conductive electrode disposed in a second part of the dielectric layer to connect the phase change material layer with the conductive layer.

12. The phase change memory device as claimed in claim 11, wherein the second conductive electrode penetrates the phase change material layer perpendicular to a top surface of the dielectric layer and the phase change material layer surrounds a part of the second conductive electrode along a circumstance of the second conductive electrode.

* * * * *